(12) United States Patent
Sasaki

(10) Patent No.: US 11,667,515 B2
(45) Date of Patent: Jun. 6, 2023

(54) DILUTE CHEMICAL SOLUTION PRODUCTION DEVICE

(71) Applicant: KURITA WATER INDUSTRIES LTD., Tokyo (JP)

(72) Inventor: Yuuya Sasaki, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 346 days.

(21) Appl. No.: 16/618,813

(22) PCT Filed: Aug. 17, 2017

(86) PCT No.: PCT/JP2017/029509
§ 371 (c)(1),
(2) Date: Dec. 3, 2019

(87) PCT Pub. No.: WO2018/225278
PCT Pub. Date: Dec. 13, 2018

(65) Prior Publication Data
US 2020/0131022 A1    Apr. 30, 2020

(30) Foreign Application Priority Data
Jun. 6, 2017 (JP) .............................. JP2017-112012

(51) Int. Cl.
*B67D 7/74* (2010.01)
*B01J 4/00* (2006.01)
(Continued)

(52) U.S. Cl.
CPC ................ *B67D 7/743* (2013.01); *B01J 4/00* (2013.01); *B01J 4/001* (2013.01); *B67D 7/0227* (2013.01);
(Continued)

(58) Field of Classification Search
CPC ....... Y10T 137/86027; Y10T 137/2605; Y10T 137/264; Y10T 137/86002;
(Continued)

(56) References Cited

U.S. PATENT DOCUMENTS 4,545,604 A * 10/1985 Braathen ................ F16L 19/075
285/133.4
4,554,942 A * 11/1985 Williams .............. B08B 9/0325
134/166 C
(Continued)

FOREIGN PATENT DOCUMENTS

| CN | 102112215 | 8/2014 |
| GB | 2292158 | 2/1996 |

(Continued)

OTHER PUBLICATIONS

"Office Action of Taiwan Counterpart Application", dated Apr. 12, 2021, with English translation thereof, p. 1-p. 12.
(Continued)

*Primary Examiner* — William M McCalister
(74) *Attorney, Agent, or Firm* — JCIPRNET

(57) ABSTRACT

A chemical solution supply part for supplementing the chemical solution to the chemical solution storage tank and a purge gas supply part for supplying $N_2$ gas as a purge gas to the chemical solution storage tank are in communication with the chemical solution storage tank, and a first manometer serving as a pressure measurement part is arranged on the chemical solution storage tank. In addition, a drain piping is connected to a head portion of the plunger pump, and an automatically controlled air-bleed valve, which is an air-bleed mechanism, is arranged on the drain piping. On the other hand, a second manometer is arranged in the middle of the chemical solution supply pipe, and a front end of the
(Continued)

solution supply pipe on the downstream side serves as an injection point for the chemical solution S.

12 Claims, 4 Drawing Sheets

(51) Int. Cl.
  *B67D 7/36*     (2010.01)
  *B67D 7/70*     (2010.01)
  *C11D 7/04*     (2006.01)
  *C11D 7/50*     (2006.01)
  *B67D 7/02*     (2010.01)
  *B01J 4/02*     (2006.01)
  *H01L 21/02*    (2006.01)

(52) U.S. Cl.
  CPC .............. *B67D 7/36* (2013.01); *B67D 7/70* (2013.01); *C11D 7/04* (2013.01); *C11D 7/50* (2013.01); *B01J 4/008* (2013.01); *B01J 4/02* (2013.01); *H01L 21/02041* (2013.01)

(58) Field of Classification Search
  CPC .. Y10T 137/86035; B67D 7/743; B67D 7/36; B67D 7/70; B67D 7/0227; B01J 4/001; B01J 4/02; B01J 4/00; B01J 4/008; C11D 7/04; C11D 7/50; C11D 11/0047; H01L 21/02041; H01L 21/6704; H01L 21/67075
  USPC ............ 137/565.16, 115.13, 115.25, 565.13, 137/565.17
  See application file for complete search history.

(56) References Cited

U.S. PATENT DOCUMENTS

| | | | | |
|---|---|---|---|---|
| 5,096,087 | A * | 3/1992 | Thomas | B65D 90/501 220/627 |
| 5,143,257 | A * | 9/1992 | Austin | A01K 7/02 119/72 |
| 5,484,279 | A * | 1/1996 | Vonasek | F23G 7/008 110/238 |
| 5,944,043 | A * | 8/1999 | Glick | H01L 21/67075 137/1 |
| 6,116,260 | A * | 9/2000 | Nakagawa | B01J 4/00 137/565.17 |
| 6,435,860 | B1 * | 8/2002 | Brookshire | F23D 11/383 110/238 |
| 6,708,702 | B2 * | 3/2004 | Kamikawa | H01L 21/67051 134/186 |
| 7,878,214 | B1 * | 2/2011 | Jansen | B64G 1/402 137/12 |
| 9,605,411 | B2 * | 3/2017 | Wen | E02F 9/2278 |
| 2003/0099549 | A1 * | 5/2003 | Shen | F04B 49/08 417/44.2 |
| 2006/0151027 | A1 * | 7/2006 | Pearson | F17C 13/045 137/113 |
| 2009/0026421 | A1 * | 1/2009 | Li | B82Y 20/00 118/716 |
| 2012/0145251 | A1 * | 6/2012 | Robol | F16K 24/04 137/14 |
| 2014/0230908 | A1 | 8/2014 | Tokoshima et al. | |
| 2015/0267869 | A1 * | 9/2015 | Orita | B67D 3/0038 137/565.17 |
| 2015/0292643 | A1 * | 10/2015 | Biegner | F23K 5/147 137/1 |
| 2016/0362305 | A1 * | 12/2016 | Ohtsuki | C02F 1/008 |

FOREIGN PATENT DOCUMENTS

| | | |
|---|---|---|
| JP | S59139590 | 9/1984 |
| JP | H06344533 | 12/1994 |
| JP | H11253773 | 9/1999 |
| JP | 2004230293 | 8/2004 |
| JP | 2007209864 | 8/2007 |
| JP | 2014160759 | 9/2014 |
| JP | 2015162671 | 9/2015 |
| TW | 200621617 | 7/2006 |
| WO | 2016042933 | 3/2016 |

OTHER PUBLICATIONS

"International Search Report (Form PCT/ISA/210) of PCT/JP2017/029509," dated Oct. 24, 2017, with English translation thereof, pp. 1-4.

* cited by examiner

DILUTE CHEMICAL SOLUTION PRODUCTION DEVICE

CROSS-REFERENCE TO RELATED APPLICATION

This application is a 371 application of the international PCT application serial no. PCT/JP2017/029509, filed on Aug. 17, 2017, which claims the priority benefits of Japan application no. 2017-112012, filed on Jun. 6, 2017. The entirety of each of the above-mentioned patent applications is hereby incorporated by reference herein and made a part of this specification.

BACKGROUND OF THE INVENTION

Technical Field

The present invention relates to a dilute chemical solution production device which produces a dilute chemical solution, in particular, to a dilute chemical solution production device capable of producing, with a simple structure, a dilute chemical solution with an extremely low concentration of acid or alkali which is effective in a cleaning/rinsing process or the like of a semiconductor wafer or the like.

Related Art

In a production process of a semiconductor wafer or LCD, ultrapure water in which impurities are highly removed is used to perform cleaning of the semiconductor wafer or a glass substrate.

In this cleaning of semiconductor wafer using the ultrapure water, there is a risk that the ultrapure water easily generates static electricity due to a high specific resistance value, causing electrostatic breakdown of an insulating film or reattachment of fine particles. Therefore, water in which a solute effective for control of pH or oxidation-reduction potential is dissolved to a very low concentration (hereinafter referred to as a dilute chemical solution) may be used. Here, dissolution of a gas such as $H_2$, $CO_2$, $O_3$, $NH_3$ or the like is also performed, but the device becomes complicated to dissolve the gas. Therefore, the minimum required acid or alkali or a small amount of chemical solution such as an oxidizing agent, a reducing agent or the like is added so that the ultrapure water has a pH or oxidation-reduction potential corresponding to a use purpose of cleaning, rinsing or the like.

As the device for adding a small amount of chemical solution to the ultrapure water, for example, the following device is used which dilutes a chemical solution to the middle of a desired concentration by ultrapure water to prepare a diluted chemical solution and further adds the diluted chemical solution to ultrapure water to get a dilute chemical solution. The dilute chemical solution production device has, as shown in FIG. 6, a diluted chemical solution storage tank 21 and a chemical solution storage tank 22, a chemical solution supply pipe 23 equipped with a liquid feeding pump 24 which supplies a chemical solution S from the chemical solution storage tank 22, a supply part 25 and a dilution solution supply pipe 26 of ultrapure water W which is a dilution solution, and a diluted chemical solution supply pipe 27 equipped with a diaphragm pump 28 which communicates the diluted chemical solution storage tank 21 and an injection point 29 to an ultrapure water flow path. Then, as shown in FIG. 7, the diluted chemical solution supply pipe 27 is in communication with the ultrapure water flow path 31 in a joint pipe 32 which is the injection point 29. Besides, reference numeral 33 denotes an opening/closing valve.

In the conventional dilute chemical solution production device, the chemical solution S and the ultrapure water W are supplied to the diluted chemical solution storage tank 21 to produce a diluted chemical solution S0 in which the chemical solution S is diluted to some extent, and the diluted chemical solution S0 is supplied to the ultrapure water flow path 31, and thereby dilution is further performed to prepare a dilute chemical solution S1. However, in the dilute chemical solution production device, both the device for producing the diluted chemical solution and the device for adding the ultrapure water to the diluted chemical solution are required, and there are problems of restriction on the installation location and cost increase.

Therefore, it is possible to reduce the number of components of the device to achieve compactness when the small amount of chemical solution (stock solution) is directly added to the ultrapure water to prepare the dilute chemical solution, but there is a problem that stable supply of the small amount of chemical solution is difficult when the extremely small amount of stock solution S is directly added to the ultrapure water. In order to solve the problem, a device is proposed in patent literature 1, in which pressure in a tank for accumulating the chemical solution is controlled by $N_2$ gas or the like, and the chemical solution is pushed out little by little by the pressure and directly supplied to the ultrapure water, thereby preparing the dilute chemical solution.

LITERATURE OF RELATED ART

Patent Literature

Patent literature 1: International Publication No. 2016/042933

SUMMARY

Problems to be Solved

However, because the dilute chemical solution production device described in the above patent literature 1 controls the pressure in the tank for accumulating the chemical solution, and pushes the small amount of chemical solution out by the pressure to thereby supply the chemical solution, there is a problem that the flow rate of the ultrapure water, the chemical solution concentration, and the pressure in the tank for accumulating the chemical solution should be respectively measured to perform subtle pressure control so that the concentration of the dilute chemical solution becomes a prescribed value, causing complication of the device structure. In addition, although the dilute chemical solution production device described in patent literature 1 can precisely supply the chemical solution to the ultrapure water, uniform dispersion of the supplied chemical solution in the ultrapure water may be a problem.

The present invention is accomplished based on the above-described problems and provides a dilute chemical solution production device capable of stably producing, with a simple structure, a dilute chemical solution with an extremely low concentration of acid, alkali, or the like.

Means to Solve Problems

In order to achieve the above purpose, the present invention provides a dilute chemical solution production device, which is a production device of dilute chemical solution for adding a second liquid to a first liquid to thereby produce a dilute chemical solution of the second liquid; the dilute chemical solution production device includes: a first piping for flowing the first liquid; a stock solution tank for accumulating the second liquid; a second piping for connecting the stock solution tank and the first piping; and a plunger pump for adding the second liquid into the first piping through the second piping; a pressurization part is attached to the stock solution tank, and a front end of the second piping is connected in a state of being inserted to an approximately central position in the radial direction of the first piping (invention 1).

The plunger pump is suitable for small amount injection compared with other pumps, but stable supply is easily hindered due to air bubbles. Therefore, the pressurization part is arranged on the stock solution tank, and the air bubbles of the second liquid in the stock solution tank are suppressed by pressurization in the stock solution tank, and thereby a small amount of the stock solution can be stably injected. Furthermore, as it is clear from a study result of the inventor, the reason for insufficient dispersion of the second liquid which is the chemical solution added in small amount in the first liquid which is ultrapure water or the like is that the second liquid is present, due to the small amount, unevenly in the first liquid that flows in a laminar flow state in the first piping, and the second liquid can be uniformly dispersed in the first piping by inserting the front end of the small-diameter second piping to the approximately central position in the radial direction of the first piping. Consequently, according to the invention (invention 1), a general plunger pump can be used to stably produce the dilute chemical solution with an extremely low concentration of acid or alkali, or the like.

In the above invention (invention 1), preferably, an air-bleed mechanism is attached to the plunger pump (invention 2).

According to this invention (invention 2), even when air bubbles are mixed into the plunger pump, air in the plunger pump can be emitted by emitting the gas from the air-bleed mechanism.

In the above invention (invention 2), preferably, a pressure measurement part is arranged on the second piping on the downstream side of the plunger pump, and the pressure measurement part is connected to a control part which controls the air-bleed mechanism, and the control part controls to activate the air-bleed mechanism when the measurement pressure of the pressure measurement part is below a prescribed value (invention 3).

According to this invention (invention 3), the pressure of the second liquid circulating in the second piping is reduced significantly when air is mixed into the second piping, and thus the air in the plunger pump can be automatically emitted by activating the air-bleed mechanism when the circulation pressure of the second liquid measured by the pressure measurement part is below a prescribed value.

In the above inventions (inventions 1-3), preferably, a pressure measurement part which measures the pressure in the stock solution tank is arranged on the stock solution tank (invention 4).

According to this invention (invention 4), the pressure under which air bubbles are not generated in the second liquid is different depending on the type and temperature of the second liquid accumulated in the stock solution tank and the atmospheric temperature, and thus the pressure in the stock solution tank can be measured and thereby be monitored so that the pressure under which air bubbles are not generated is maintained.

In the above inventions (inventions 1-4), preferably, the first liquid is ultrapure water, and the second liquid is ammonia (invention 5).

According to this invention (invention 5), by making a dilute ammonia aqueous solution of high purity, treatment such as cleaning or the like of a semiconductor wafer can be appropriately performed.

Effect

According to the dilute chemical solution production device of the present invention, the air bubbles of the second liquid can be suppressed and the second liquid can be uniformly dispersed in the first liquid in the first piping, and thus a dilute chemical solution with an extremely low concentration of acid, alkali, or the like can be stably produced with a simple structure using a general plunger pump.

DESCRIPTION OF THE EMBODIMENTS

Figure 1:
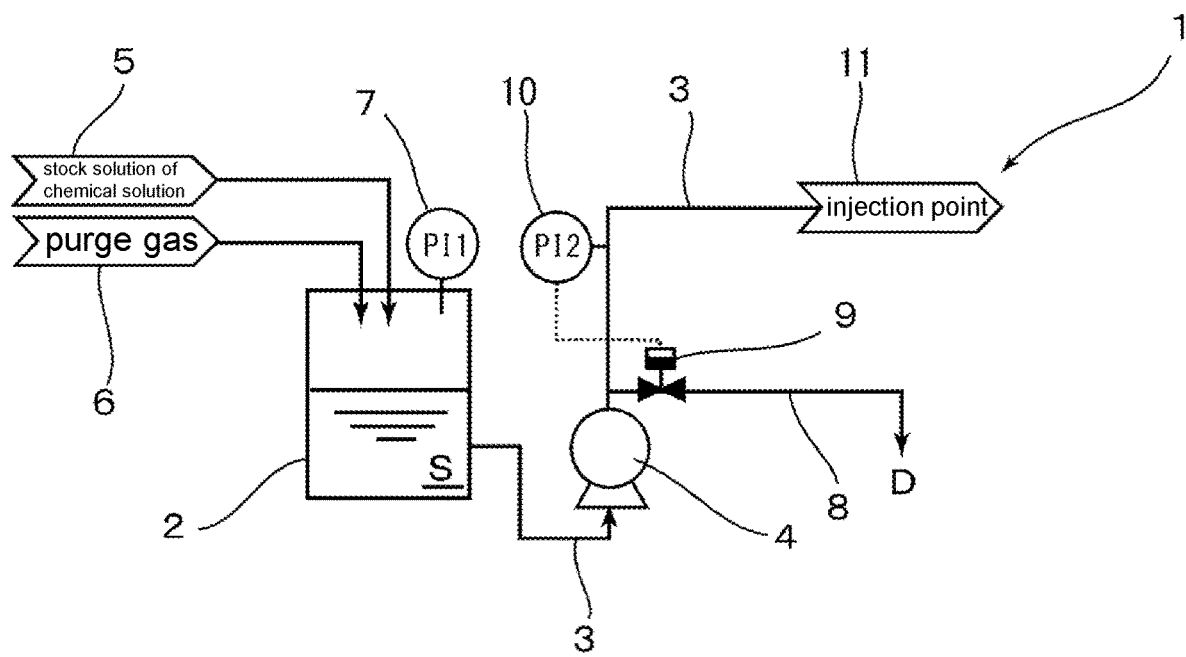
FIG. 1 is a flow chart showing a dilute chemical solution production device of a first embodiment of the present invention.
Figure 2:
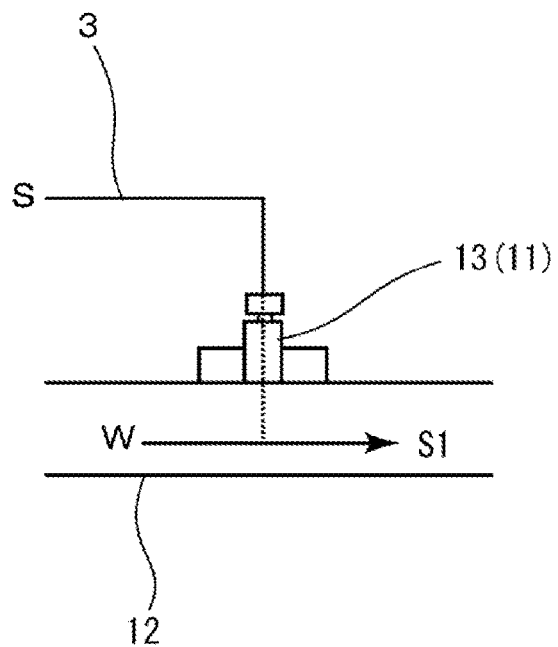
FIG. 2 is a schematic view showing an injection structure of a second liquid of the dilute chemical solution production device of the first embodiment.

FIG. 1 and FIG. 2 show a dilute chemical solution production device of a first embodiment of the present invention. In FIG. 1, a dilute chemical solution production device 1 has a chemical solution storage tank 2 which is a stock solution tank, and a chemical solution supply pipe 3 serving as a second piping including a plunger pump 4 for supplying, from the chemical solution storage tank 2, a chemical solution S which is a second liquid. A chemical solution supply part 5 and a purge gas supply part 6 are in communication with the chemical solution storage tank 2, the chemical solution supply part 5 supplementing an ammonia solution (stock solution) which is the chemical solution S to the chemical solution storage tank 2, the purge gas supply part 6 supplying $N_2$ gas which is an inert gas as a purge gas to the chemical solution storage tank 2; and a first manometer 7 serving as a first pressure measurement part is arranged on the chemical solution storage tank 2. By a control part not shown, the plunger pump 4 can perform control so that the supply amount fluctuates corresponding to the flow rate of an ultrapure water flow path 12 described later.

In addition, a drain piping 8 is connected to a head portion of the plunger pump 4, and an automatically controlled air-bleed valve 9, which is an air-bleed mechanism, is arranged on the drain piping 8. On the other hand, a second manometer 10 serving as a pressure measurement part is arranged in the middle of the chemical solution supply pipe 3, and a front end of the solution supply pipe 3 on a downstream side serves as an injection point 11 for the chemical solution S. The second manometer 10 is connected to a control part (not shown) which controls the air-bleed valve 9, and the control part controls to activate the air-bleed valve 9 when the measurement pressure of the second manometer 10 is below a prescribed value. Then, as shown in FIG. 2, as for the injection point 11, the chemical solution supply pipe 3 is connected, via a bore-through joint 13, to the ultrapure water flow path 12 serving as a first piping of ultrapure water W which is a first liquid.

In the dilute chemical solution production device 1 described above, preferably, the chemical solution supply pipe 3 is made of fluorinated resin such as perfluoroalkoxy fluororesin (PFA) or the like, and an inner diameter thereof is 0.1-4 mm. When the inner diameter of the chemical solution supply pipe 3 is larger than 4 mm, the pressure gradient of a fluid flowing through the chemical solution supply pipe 3 becomes too small due to the small amount of the chemical solution S that is supplied, and thus control of the flow rate becomes difficult; on the other hand, when the inner diameter is 0.1 mm or smaller, the inner diameter of the pipe is too small and the pressure gradient of the fluid becomes too large, and the control of the flow rate becomes even more difficult, and thus it is not preferable. Besides, the ultrapure water flow path 12 serving as the first piping may have an inner diameter of about 10-50 mm, particularly about 20-40 mm.

The front end of the chemical solution supply pipe 3 on the downstream side is inserted, via the bore-through joint 13, to the approximately central position in the radial direction of the ultrapure water flow path 12 which is the first piping, for example, a position of ⅓-⅔, preferably ⅖-⅗ of the inner diameter of the ultrapure water flow path 12. In the embodiment, since the injection amount of the chemical solution S is extremely small, it is difficult to uniformly disperse the chemical solution S in the ultrapure water flow path 12 when the front end of the chemical solution supply pipe 3 is in a position of ⅓ or less or ⅔ or more of the inner diameter of the ultrapure water flow path 12 in the radial direction of the ultrapure water flow path 12, and thus it is not preferable.

A production method of the dilute chemical solution using the dilute chemical solution production device 1 of the embodiment having the above-described configuration is described below.

First, a prescribed amount of chemical solution S is accumulated from the chemical solution supply part 5 to the chemical solution storage tank 2, and $N_2$ gas is supplied from the purge gas supply part 6. At this time, the interior of the chemical solution storage tank 2 is subjected to pressurization of about 0.01-1 MPa with respect to the atmospheric pressure by the $N_2$ gas, and a generation of air bubbles of the chemical solution S in the chemical solution storage tank 2 is suppressed. The pressurization condition may be properly selected in the above range according to the type of the chemical solution S that is used, the ambient temperature, and the temperature of the chemical solution S, and may be controlled by the first manometer 7. Besides, the pressurization condition is not used for supplying the chemical solution S, and thus precise control corresponding to the supply amount or the like is not required.

Next, the chemical solution S is supplied from the chemical solution storage tank 2 via the chemical solution supply pipe 3 to the injection point 11 by the plunger pump 4. Preferably, the circulation pressure of the chemical solution S that circulates in the chemical solution supply pipe 3 is set to be slightly higher than the injection pressure in the injection point 11. For example, the circulation pressure is set to 0.31 MPa or the like when the injection pressure in the injection point 11 is 0.3 MPa. In addition, the supply amount of the chemical solution S determined by the plunger pump 4 is 0.001-3.0 mL/min, particularly 0.05-1.0 mL/min, which is very small, and the supply amount determined by the plunger pump 4 can be controlled in the above range corresponding to the flow rate of the ultrapure water W so that the chemical solution S has a desired concentration.

Accordingly, in the plunger pump 4, when there are air bubbles in the chemical solution S and air is mixed into the plunger pump 4, the air bubbles are attached to a small ball check valve of the plunger pump 4 and a check effect disappears, and thus an injection defect is generated, making it difficult to produce the dilute chemical solution of the chemical solution S having a desired concentration. When air is mixed into the plunger pump 4, the pressure of the chemical solution S discharged from the plunger pump 4 is rapidly reduced, and thus when the circulation pressure of the chemical solution S that circulates in the chemical solution supply pipe 3 is measured by the second manometer 10 and the circulation pressure is reduced by about 20%, for example, the circulation pressure is below 0.25 MPa when the circulation pressure of the chemical solution S is set to 0.31 MPa, a judgment is made that air is mixed in.

Then, when a judgment is made that air is mixed in, the air-bleed valve 9 is activated by the control part connected to the second manometer 10, and the chemical solution S is circulated in the drain piping 8 to emit the air from the air-bleed valve 9 and emit the liquid component (the chemical solution S) as a drain D. Accordingly, in the embodiment, the air-bleed valve 9 can be used as an automatic valve to perform air-bleed at once when pressure reduction is sensed, and thus the injection amount of the chemical solution S can be rapidly restored to the set value.

In this way, the prescribed amount of chemical solution S is supplied from the chemical solution supply pipe 3 to the injection point 11. Then, the chemical solution S flows into the ultrapure water flow path 12 via the bore-through joint 13. At this time, since the front end of the chemical solution supply pipe 3 on the downstream side is inserted to the approximately central position in the radial direction of the ultrapure water flow path 12, preferably a position of ⅓-⅔, particularly ⅖-⅗ of the inner diameter, the chemical solution S can be uniformly dispersed in the ultrapure water flow path 12, and a homogeneous ammonia dilute chemical solution S1 can be produced. The ammonia dilute chemical solution S1 can be appropriately used in treatment such as cleaning of a semiconductor wafer.

Figure 3:
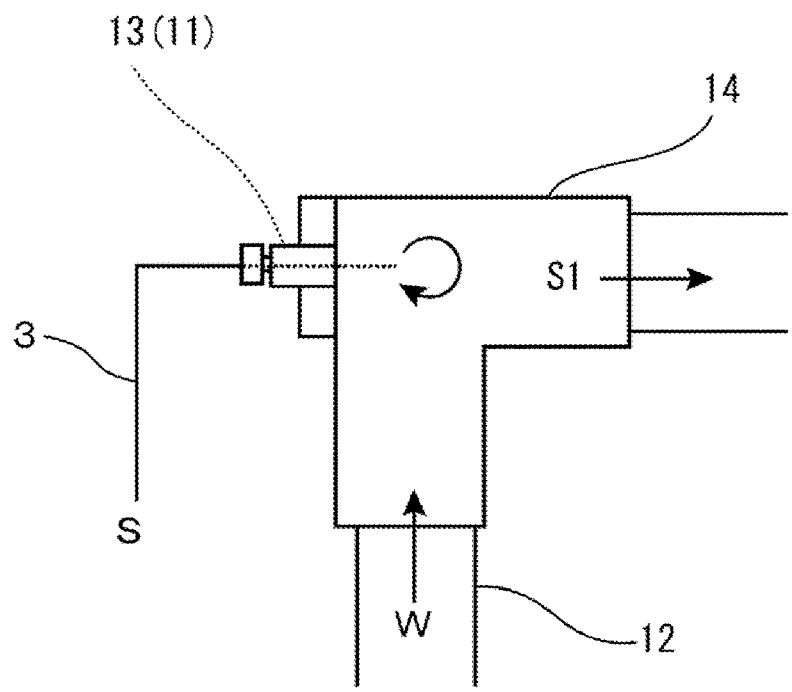
FIG. 3 is a schematic view showing an injection structure of a second liquid of a dilute chemical solution production device of a second embodiment of the present invention.

Next, a dilute chemical solution production device of a second embodiment of the present invention is described based on FIG. 3. In the dilute chemical solution production device of the embodiment, as shown in FIG. 3, the ultrapure water flow path 12 serving as the first piping of the ultrapure water W being the first liquid bends, the chemical solution supply pipe 3 (the injection point 11) is connected, via the bore-through joint 13, to an elbow member 14 that is arranged on the bending portion of the ultrapure water flow path 12, and the front end of the chemical solution supply pipe 3 on the downstream side is inserted to the approximately central position in the radial direction of the ultrapure water flow path 12, preferably a position of ⅓-⅔, particularly ⅖-⅗ of the inner diameter.

By setting the injection point 11 in the elbow member 14 arranged on the bending portion of the ultrapure water flow path 12 as in this embodiment, the ultrapure water W is in a turbulent state in the bending portion (the elbow portion) of the ultrapure water flow path 12, and thus a good diffusion of the chemical solution S to the ultrapure water W can be expected, and a more homogeneous dilute chemical solution S1 can be produced.

The dilute chemical solution production device of the present invention is described above based on the aforementioned embodiments, but the present invention is not limited to the above embodiments and various modifications can be implemented. For example, the chemical solution S is not limited to the ammonia solution, and hydrochloric acid, sulfuric acid, hydrofluoric acid, nitric acid or carbonic water which is an acid, or an aqueous solution of potassium hydroxide or sodium hydroxide which is an alkalis, or the like can be used. In addition, in some cases, the present invention is also applicable to gas-dissolved water in which a gas component such as hydrogen, oxygen, and ozone is dissolved. Besides, in each embodiment described above, the case is described in which the ultrapure water W is used, but the same can also apply to pure water that is lower in purity than the ultrapure water W.

Example

Examples and comparative examples are shown below, and the present invention is described more specifically. However, the present invention is not limited by these descriptions.

Example 1

The dilute chemical solution production device 1 shown in FIG. 1 and FIG. 2 are used, and the ammonia solution with a concentration of 29% is used as a stock solution of the chemical solution S to produce the dilute ammonia water S1.

In the dilute chemical solution production device 1, the flow rate fluctuation range is made to fluctuate in 12.0 L/min-14.5 L/min with a flow volume of 13.2 L/min of the ultrapure water W and the set ammonia concentration is set to 2 ppm, and the ammonia stock solution S is supplied with an injection amount of 0.092 mL/min-0.111 mL/min from the plunger pump 4 corresponding to the flow rate of the ultrapure water W.

Figure 4:
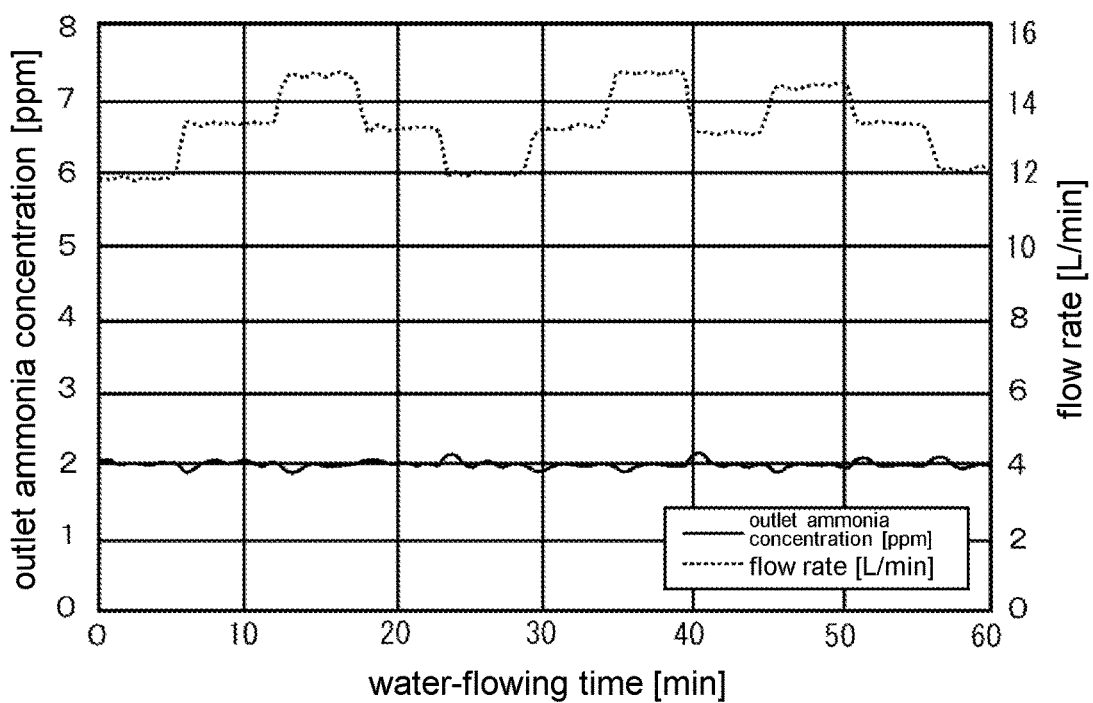
FIG. 4 is a graph showing the concentration and the flow rate of dilute ammonia water obtained by a dilute chemical solution production device of Example 1.

A result that is obtained by continuously measuring the concentration of the ammonia dilute chemical solution S1 of the dilute chemical solution production device 1 for one hour is shown in FIG. 4 together with the flow rate of the ultrapure water W.

Comparative Example 1

Figure 6:
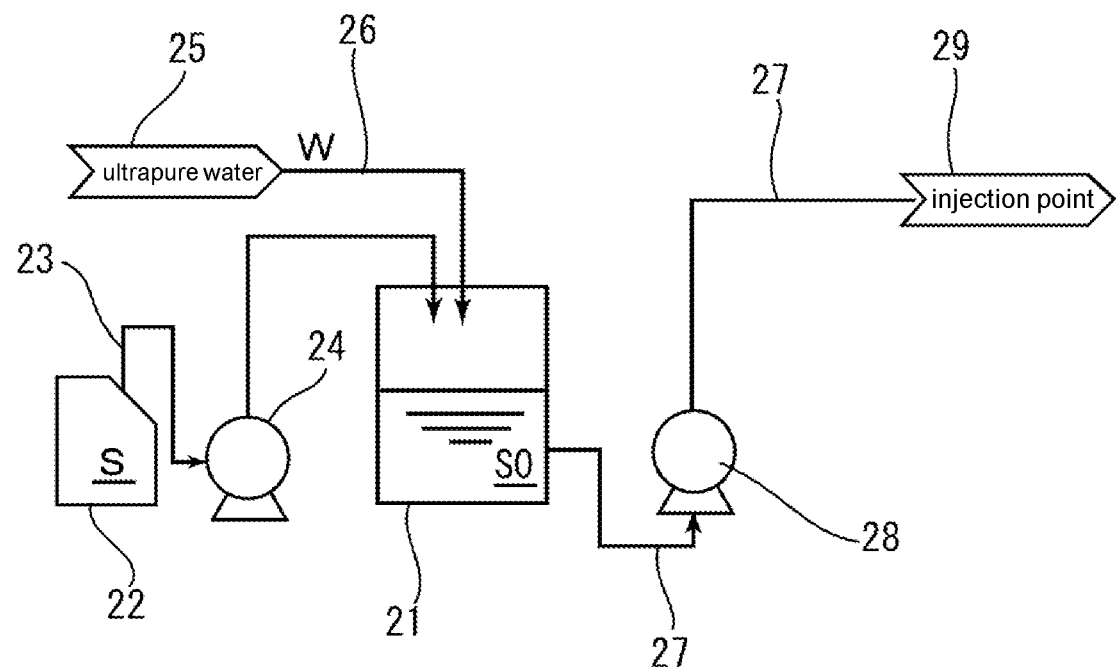
FIG. 6 is a flow chart showing a conventional dilute chemical solution production device.
Figure 7:
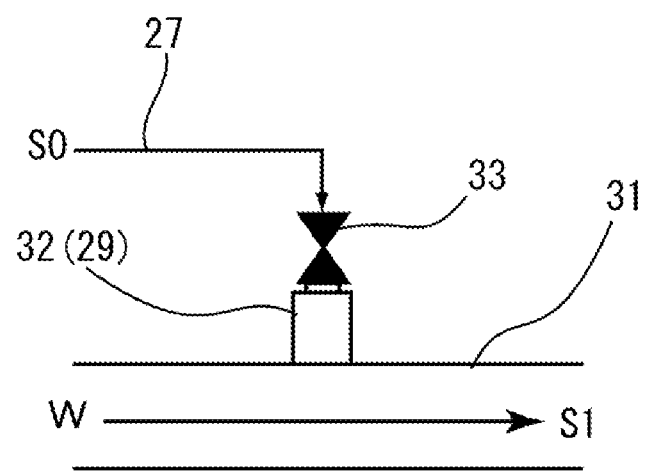
FIG. 7 is a schematic view showing an injection structure of a second liquid of the conventional dilute chemical solution production device.

The conventional dilute chemical solution production device shown in FIG. 6 and FIG. 7 is used, and the ammonia solution with a concentration of 29% is used as a stock solution of the chemical solution S to produce the dilute ammonia water as the dilute chemical solution S1.

In the dilute chemical solution production device, the flow rate fluctuation range is made to fluctuate in 11.0 L/min-14.5 L/min with a flow volume of 13.2 L/min of the ultrapure water W and the set ammonia concentration is set to 2 ppm, and the diluted chemical solution S0 obtained by diluting the ammonia stock solution S with a concentration of 29% is supplied from a diaphragm pump 28.

Figure 5:
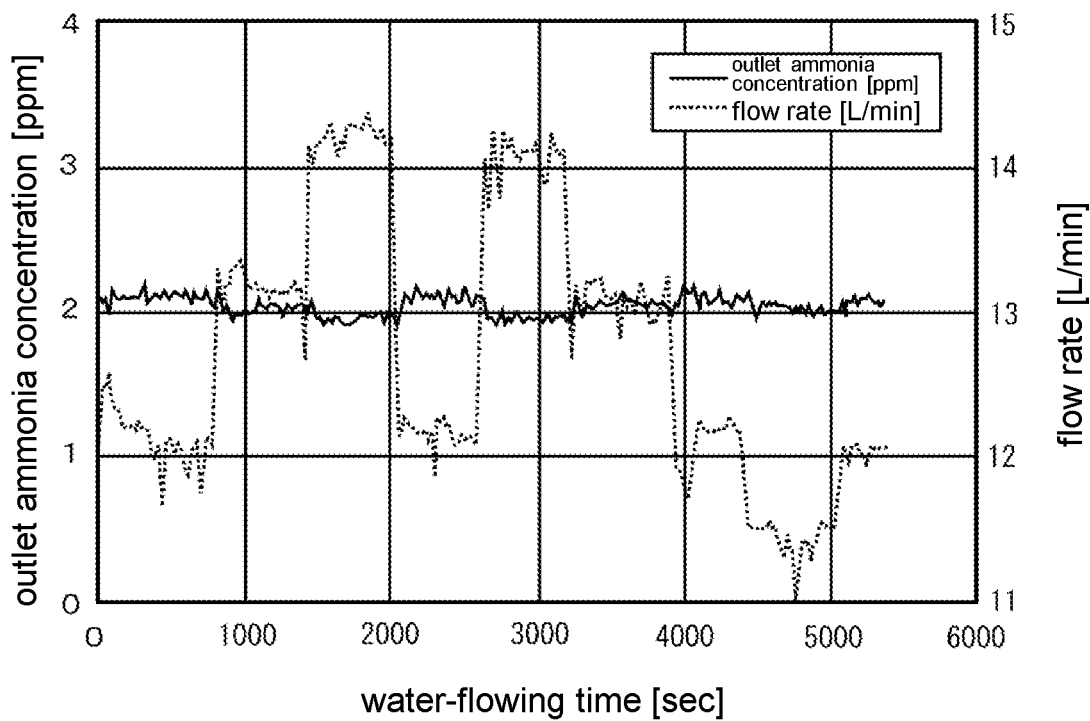
FIG. 5 is a graph showing the concentration and the flow rate of dilute ammonia water obtained by a dilute chemical solution production device of Comparative Example 1.

A result that is obtained by continuously measuring the concentration of the ammonia dilute chemical solution S1 of the dilute chemical solution production device for one hour is shown in FIG. 5 together with the flow rate of the ultrapure water W.

As it is clear from FIG. 4 and FIG. 5, when the ammonia dilute chemical solution S1 is produced by the dilute chemical solution production device of Example 1, the trackability for fluctuations in the flow rate of the ultrapure water W is good, the ammonia concentration of the ammonia dilute chemical solution S1 is stable, and the fluctuation range of the ammonia concentration is about ±5%. On the other hand, when the ammonia dilute chemical solution S1 is produced by the dilute chemical solution production device of Comparative Example 1 which is a conventional example, the trackability for fluctuations in the flow rate of the ultrapure water W is relatively good, but the fluctuation range of the ammonia concentration of the ammonia dilute chemical solution S1 is about ±10%, and Example 1 is more advantageous when it is taken into consideration that the device of Comparative Example 1 has a larger occupied space and more components.

REFERENCE SIGNS LIST 1 dilute chemical solution production device
2 chemical solution storage tank (stock solution tank)
3 chemical solution supply pipe (second piping)
4 plunger pump
5 chemical solution supply part
6 purge gas supply part
7 first manometer (pressure measurement part)
8 drain piping
9 air-bleed valve (air-bleed mechanism)
10 second manometer (pressure measurement part)
11 injection point
12 ultrapure water flow path (first piping)
13 bore-through joint
14 elbow member
W ultrapure water (first liquid)
S chemical solution (second liquid: ammonia solution)
S1 ammonia dilute chemical solution (dilute chemical solution)

What is claimed is:

1. A dilute chemical solution production device, which is a production device of dilute chemical solution for adding a second liquid to a first liquid to thereby produce a dilute chemical solution of the second liquid, the production device comprising:
 a first piping having an inner diameter of 10-50 mm for flowing the first liquid;
 a stock solution tank for accumulating the second liquid;
 a second piping having an inner diameter of 0.1-4 mm for connecting the stock solution tank and the first piping; and
 a plunger pump for adding the second liquid into the first piping through the second piping;
 wherein a purge gas supply part is attached to the stock solution tank, $N_2$ gas is supplied from the purge gas supply part, the stock solution tank is subjected to pressurization by the $N_2$ gas, and a front end of the second piping is connected, via a bore-through joint, to an approximately central position in a radial direction of the first piping.

2. The dilute chemical solution production device according to claim 1, wherein an air-bleed mechanism is attached to the plunger pump.

3. The dilute chemical solution production device according to claim 2, wherein a pressure measurement part is arranged on the second piping on the downstream side of the plunger pump, and the pressure measurement part is connected to a control part which controls the air-bleed mechanism, and the control part controls to activate the air-bleed mechanism when a measurement pressure of the pressure measurement part is below a prescribed value.

4. The dilute chemical solution production device according to claim 1, wherein a first pressure measurement part which measures the pressure in the stock solution tank is arranged on the stock solution tank.

5. The dilute chemical solution production device according to claim 1, wherein the first liquid is ultrapure water, and the second liquid is ammonia.

6. The dilute chemical solution production device according to claim 2, wherein a first pressure measurement part which measures the pressure in the stock solution tank is arranged on the stock solution tank.

7. The dilute chemical solution production device according to claim 3, wherein a first pressure measurement part which measures the pressure in the stock solution tank is arranged on the stock solution tank.

8. The dilute chemical solution production device according to claim 2, wherein the first liquid is ultrapure water, and the second liquid is ammonia.

9. The dilute chemical solution production device according to claim 3, wherein the first liquid is ultrapure water, and the second liquid is ammonia.

10. The dilute chemical solution production device according to claim 4, wherein the first liquid is ultrapure water, and the second liquid is ammonia.

11. The dilute chemical solution production device according to claim 6, wherein the first liquid is ultrapure water, and the second liquid is ammonia.

12. The dilute chemical solution production device according to claim 7, wherein the first liquid is ultrapure water, and the second liquid is ammonia.

* * * * *